(12) United States Patent
Wang et al.

(10) Patent No.: US 7,994,870 B2
(45) Date of Patent: Aug. 9, 2011

(54) TUNABLE FILTER WITH GAIN CONTROL CIRCUIT

(75) Inventors: Cheng-Han Wang, San Jose, CA (US); Tzu-wang Pan, Saratoga, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 129 days.

(21) Appl. No.: 12/254,155

(22) Filed: Oct. 20, 2008

(65) Prior Publication Data

US 2010/0097152 A1    Apr. 22, 2010

(51) Int. Cl.
*H03L 7/00*    (2006.01)
(52) U.S. Cl. ............... 331/172; 331/18; 331/2
(58) Field of Classification Search .............. 331/59, 331/44, 182, 74
See application file for complete search history.

(56) References Cited

U.S. PATENT DOCUMENTS

| | | | |
|---|---|---|---|
| 3,931,575 A * | 1/1976 | Amoroso, Jr. | ............ 455/75 |
| 6,356,143 B2 * | 3/2002 | Waltman | ............ 327/557 |
| 6,778,023 B2 | 8/2004 | Christensen | |
| 7,453,934 B2 | 11/2008 | Seppinen et al. | |
| 2006/0267698 A1 | 11/2006 | Erdogan et al. | |

FOREIGN PATENT DOCUMENTS

| | | |
|---|---|---|
| EP | 1780888 A1 | 5/2007 |
| EP | 1804379 A1 | 7/2007 |
| WO | WO2008099293 | 8/2008 |

OTHER PUBLICATIONS

Durharn A M et al: "Low-distortion Continuous-time Integrated CMOS Filters for the Audio-DSP Interface" Consumer Electronics, 1992. Digest of Technical Papers. ICCE., IEEE 1992 International Conference on Rosemont, IL, USA Jun. 2-4, 1992, New York, NY, USA, IEEE, US, pp. 92-93, XP010102922.
International Search Report and Written Opinion—PCT/US2009/061386, International Search Authority—European Patent Office—Jan. 29, 2010.

* cited by examiner

*Primary Examiner* — Joseph Chang
(74) *Attorney, Agent, or Firm* — Ramin Mobarhan

(57) ABSTRACT

An apparatus includes a filter and a gain control circuit. The filter receives and filters an input signal and provides an output signal in a first mode and operates as part of an oscillator in a second mode. The gain control circuit varies the amplitude of an oscillator signal from the oscillator in the second mode, e.g., by adjusting at least one variable gain element within the oscillator to obtain a target amplitude and/or non rail-to-rail signal swing for the oscillator signal. The apparatus may further include a bandwidth control circuit to adjust the bandwidth of the filter in the second mode. The bandwidth control circuit receives the oscillator signal, determines a target oscillation frequency corresponding to a selected bandwidth for the filter, and adjusts at least one circuit element within the filter to obtain the target oscillation frequency.

25 Claims, 7 Drawing Sheets

TUNABLE FILTER WITH GAIN CONTROL CIRCUIT

BACKGROUND

I. Field

The present disclosure relates generally to electronics, and more specifically to a tunable filter.

II. Background

Filters are commonly used in various electronics devices to pass desired signal components and attenuate undesired signal components. Different types of filters are available for different applications. For example, a wireless communication device such as a cellular phone may include a receiver and a transmitter for bi-directional communication. The receiver and transmitter may each utilize bandpass and lowpass filters.

A filter may be designed to have a particular gain and a particular bandwidth. However, the gain and bandwidth of the filter may deviate from the desired values due to various factors such as component variations. It is desirable to obtain the desired gain and bandwidth for the filter in order to achieve good performance.

DETAILED DESCRIPTION

The word "exemplary" is used herein to mean "serving as an example, instance, or illustration." Any design described herein as "exemplary" is not necessarily to be construed as preferred or advantageous over other designs.

A tunable filter with gain control circuit is described herein. The tunable filter may be used for various electronics devices such as wireless communication devices, cellular phones, personal digital assistants (PDAs), handheld devices, wireless modems, laptop computers, cordless phones, Bluetooth devices, etc. For clarity, the use of the tunable filter for a wireless communication device is described below.

Figure 1:
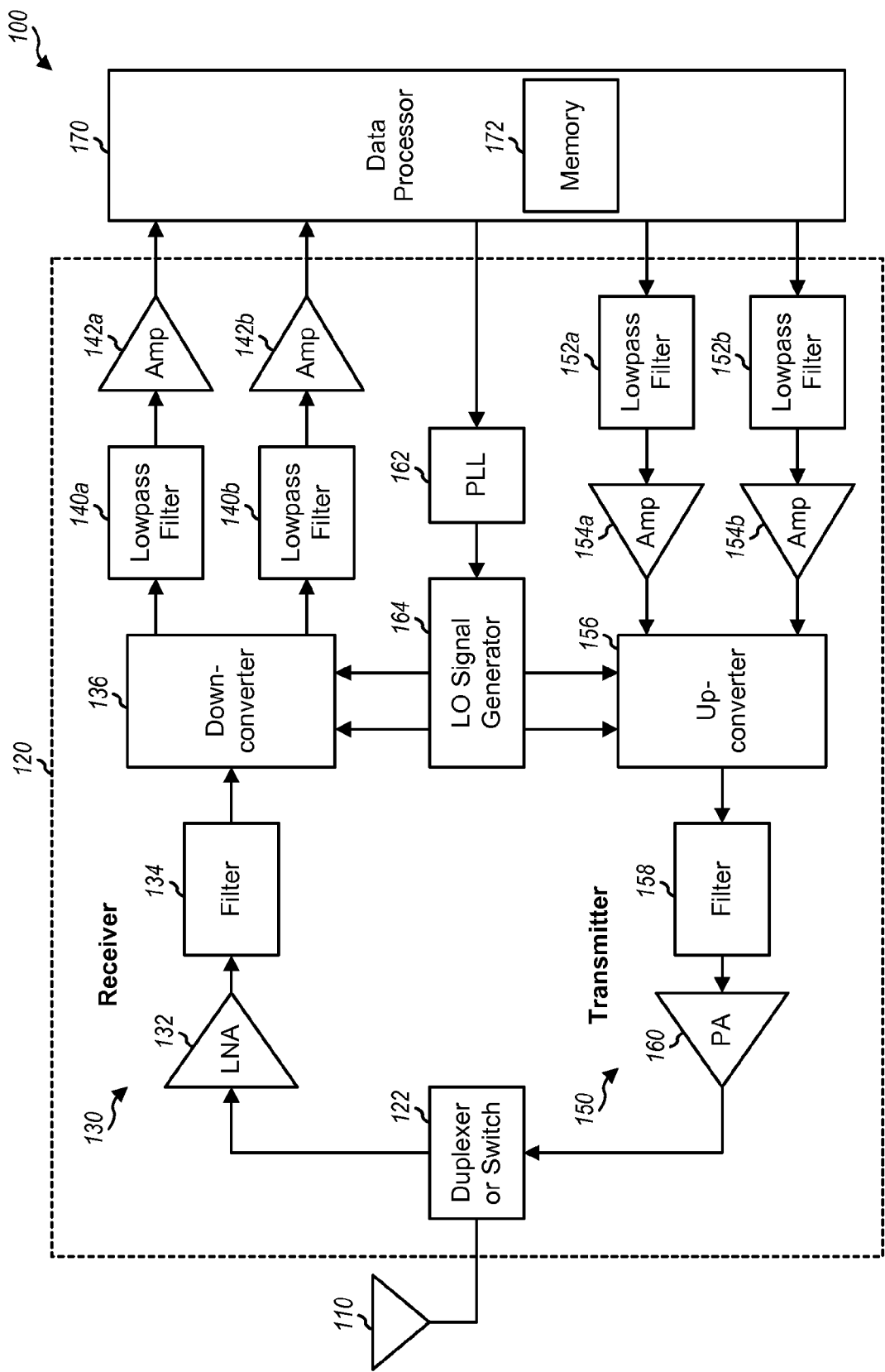
FIG. 1 shows a block diagram of a wireless communication device.

FIG. 1 shows a block diagram of a wireless communication device 100, which may be a cellular phone or some other device. In the exemplary design shown in FIG. 1, wireless device 100 includes a transceiver 120 and a data processor 170 having a memory 172 to store data and program codes. Transceiver 120 includes a receiver 130 and a transmitter 150 that support bi-directional communication. In general, wireless device 100 may include any number of receivers and any number of transmitters for any number of communication systems and frequency bands.

A receiver or a transmitter may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the exemplary design shown in FIG. 1, receiver 130 and transmitter 150 are implemented with the direct-conversion architecture.

In the receive path, an antenna 110 receives signals transmitted by base stations and/or other transmitter stations and provides a received RF signal, which is routed through a duplexer or switch 122 and provided to receiver 130. Within receiver 130, the received RF signal is amplified by a low noise amplifier (LNA) 132 and filtered by a filter 134 to obtain an RF input signal. A downconverter 136 downconverts the RF input signal with inphase and quadrature receive local oscillator signals (I and Q RX LO signals) from an LO signal generator 164 and provides I and Q downconverted signals. Lowpass filters 140a and 140b filter the I and Q downconverted signals, respectively, to remove images and out-of-band noise and provide I and Q filtered signals. Amplifiers (Amp) 142a and 142b amplify the I and Q filtered signals, respectively, to obtain the desired signal amplitude and provide I and Q input baseband signals to data processor 170.

In the transmit path, data processor 170 processes data to be transmitted and provides I and Q output baseband signals to transmitter 150. Within transmitter 150, lowpass filters 152a and 152b filter the I and Q output baseband signals, respectively, to remove images caused by the prior digital-to-analog conversion. Amplifiers 154a and 154b amplify the signals from lowpass filters 152a and 152b, respectively, and provide I and Q amplified signals. An upconverter 156 upconverts the I and Q amplified signals with I and Q transmit (TX) LO signals from LO signal generator 164 and provides an upconverted signal. A filter 158 filters the upconverted signal to remove images caused by the frequency upconversion as well as noise in a receive frequency band. A power amplifier (PA) 160 amplifies the signal from filter 158 to obtain the desired output power level and provides a transmit RF signal. The transmit RF signal is routed through duplexer or switch 122 and transmitted via antenna 110.

LO signal generator 164 generates the I and Q RX LO signals used for frequency downconversion as well as the I and Q TX LO signals used for frequency upconversion. A phase locked loop (PLL) 162 receives timing information from data processor 170 and generates control signals used to adjust the frequency and/or phase of the TX LO signals and the RX LO signals from LO signal generator 164.

FIG. 1 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. All or a portion of transceiver 120 may be implemented on one or more analog integrated circuits (ICs), RF ICs (RFICs), mixed-signal ICs, etc.

A tunable filter may be used for filter 134 and/or filters 140a and 140b in the receive path. A tunable filter may also be used for filters 152a and 152b and/or filter 158 in the transmit path. For clarity, much of the description below is for use of a tunable filter for each of filters 140*a* and 140*b*. In the following description, a numerical reference with a letter (e.g., "140*a*") refers to a specific element. A numerical reference without a letter (e.g., "140") may refer to any instance of that numerical reference (e.g., "140*a*" or "140*b*") or all instances of that numerical reference (e.g., "140*a*" and "140*b*").

Figure 2:
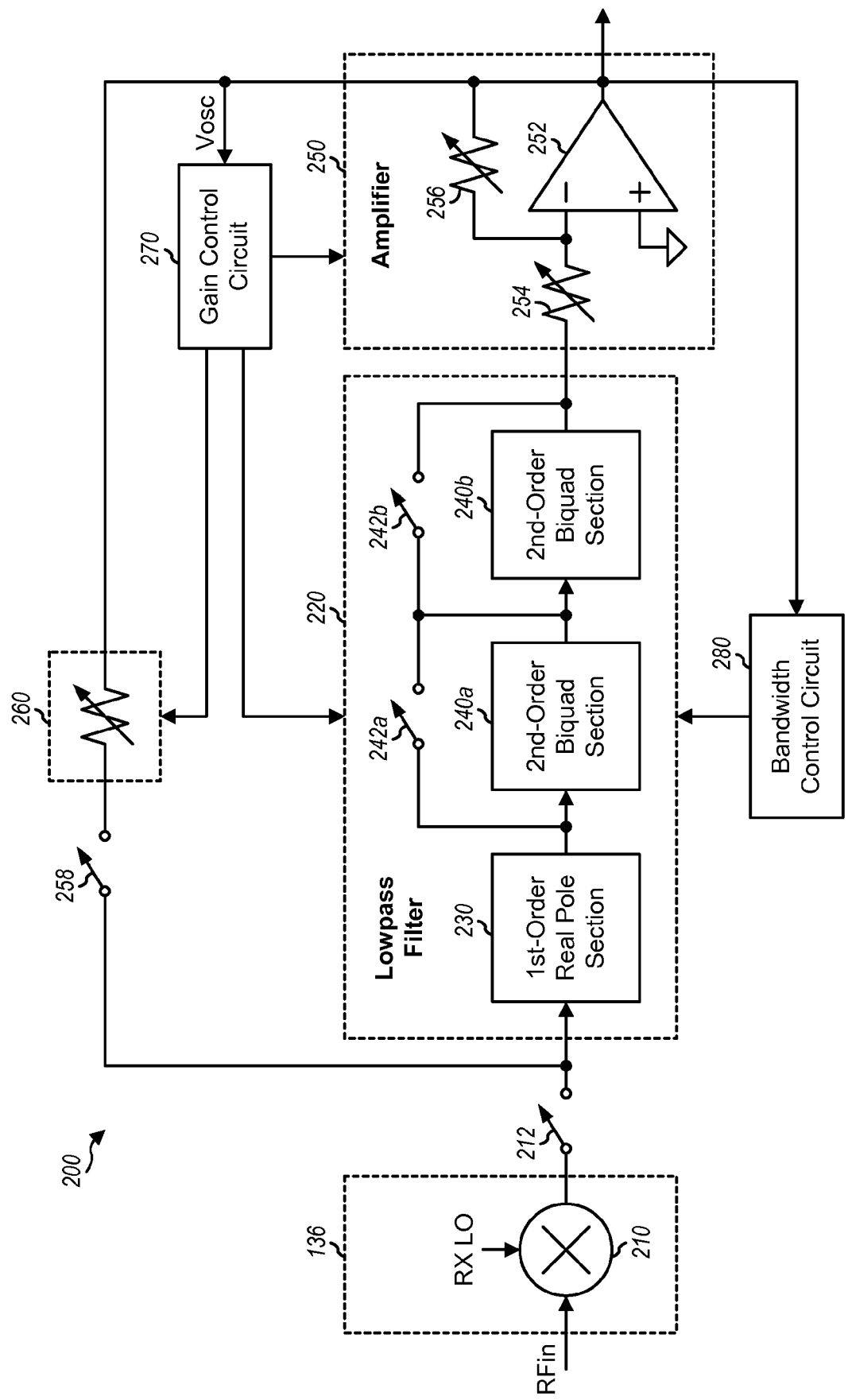
FIG. 2 shows a block diagram of a tunable filter with gain control circuit.

FIG. 2 shows a block diagram of an exemplary design of a tunable filter 200 with gain control circuit. Tunable filter 200 includes a lowpass filter 220, an amplifier 250, a gain control circuit 270, and a bandwidth control circuit 280. Lowpass filter 220 and amplifier 250 may be used for lowpass filter 140*a* or 140*b* in FIG. 1. Alternatively, lowpass filter 220 and amplifier 250 may be used for lowpass filter 140*a* and amplifier 142*a*, respectively, in the I path or for lowpass filter 140*b* and amplifier 142*b*, respectively, in the Q path in FIG. 1. Tunable filter 200 may include amplifier 250 (as shown in FIG. 2) or may omit amplifier 250.

Within downconverter 136, a mixer 210 receives and downconverts the RF input signal with an RX LO signal and provides a downconverted signal. A switch 212 is coupled between the output of mixer 210 and the input of lowpass filter 220. A switch 258 and a variable resistor 260 are coupled in series, and the combination is coupled between the input of lowpass filter 220 and the output of amplifier 250.

In the exemplary design shown in FIG. 2, lowpass filter 220 includes three filter sections 230, 240*a* and 240*b* coupled in series. First-order real pole section 230 has its input coupled to switch 212 and its output coupled to the input of second-order biquad section 240*a*. Biquad section 240*a* has its output coupled to the input of second-order biquad section 240*b*, which has its output coupled to the input of amplifier 250. Each biquad section 240 includes two complex poles designed to obtain the desired frequency response for that biquad section. A switch 242*a* is coupled across biquad section 240*a*, and a switch 242*b* is coupled across biquad section 240*b*. Lowpass filter 220 can implement a 5-th order lowpass filter when all three filter sections 230, 240*a* and 240*b* are enabled. Lowpass filter 220 can also implement (i) a first order lowpass filter when only first-order section 230 is enabled or (ii) a third-order lowpass filter when first-order section 230 and either biquad section 240*a* or 240*b* are enabled.

In the exemplary design shown in FIG. 2, amplifier 250 is a programmable gain amplifier and includes an operational amplifier (op-amp) 252 and variable resistors 254 and 256. Resistor 254 is coupled between the output of lowpass filter 220 and an inverting input of op-amp 252. Resistor 256 is coupled between the inverting input and the output of op-amp 252. Amplifier 250 may also be a variable gain amplifier (VGA).

Gain control circuit 270 receives an output signal (Vosc) from amplifier 250 and generates gain control for variable resistor 260, lowpass filter 220, and/or amplifier 250. Bandwidth control circuit 280 also receives the output signal from amplifier 250 and generates bandwidth control for lowpass filter 220.

FIG. 2 shows an exemplary design of lowpass filter 220. In general, lowpass filter 220 may have any order and may include any number of filter sections. Each filter section may have any order (e.g., first, second or higher order) and may be implemented with various designs. Lowpass filter 220 may also implement any type of filter such as Butterworth, Bessel, Chebychev, elliptical, etc. The design of lowpass filter 220 may be dependent on filtering requirements of an application in which the lowpass filter is used. Lowpass filter 220 may also be replaced with a bandpass filter, a highpass filter, a notch filter, or some other type of filter.

Figure 3:
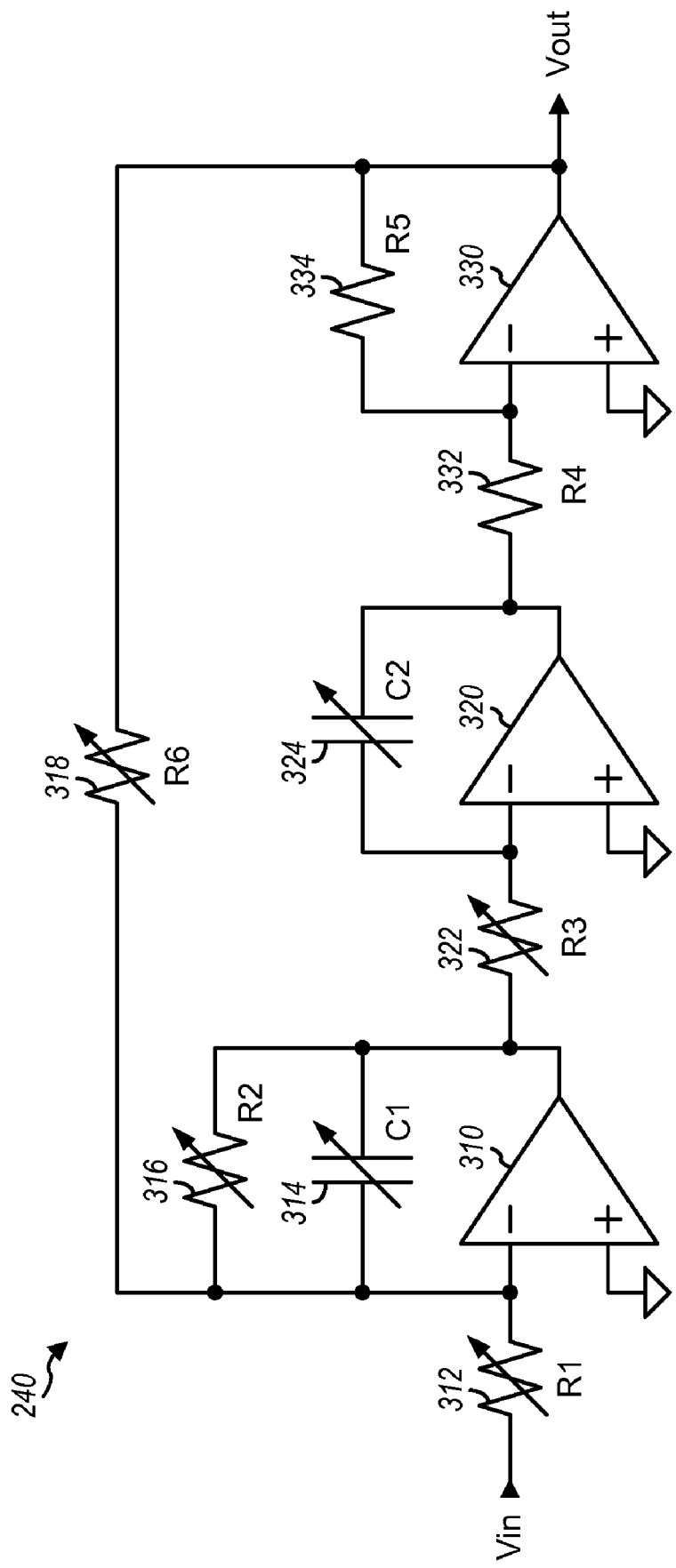
FIG. 3 shows a schematic diagram of a second-order biquad section.

FIG. 3 shows a schematic diagram of an exemplary design of a second-order biquad section 240, which may be used for each of biquad sections 240*a* and 240*b* in FIG. 2. Within biquad section 240, a variable resistor 312 with a value of R1 is coupled between an input of biquad section 240 and an inverting input of an op-amp 310. A variable capacitor 314 with a value of C1 and a variable resistor 316 with a value of R2 are coupled in parallel, and the combination is coupled between the inverting input and an output of op-amp 310. A variable resistor 322 with a value of R3 is coupled between the output of op-amp 310 and an inverting input of an op-amp 320. A variable capacitor 324 with a value of C2 is coupled between the inverting input and an output of op-amp 320. A resistor 332 with a value of R4 is coupled between the output of op-amp 320 and an inverting input of an op-amp 330. A resistor 334 with a value of R5 is coupled between the inverting input and an output of op-amp 330, which is also an output of biquad section 240. A variable resistor 318 with a value of R6 is coupled between the inverting input of op-amp 310 and the output of op-amp 330. Op-amp 330 provides signal inversion and may be omitted for a differential design.

Biquad section 240 can provide a second-order lowpass transfer function H(s) in the s-domain. The transfer function H(s) may be expressed as:

$$H(s) = \frac{G \cdot \omega_0^2}{s^2 + \frac{\omega_0}{Q}s + \omega_0^2}, \quad \text{Eq (1)}$$

where $$\omega_0 = \frac{1}{\sqrt{R3 \cdot R6 \cdot C1 \cdot C2}} \text{ is the natural frequency,} \quad \text{Eq (2)}$$

$$Q = \sqrt{\frac{R2^2 \cdot C1}{R3 \cdot R6 \cdot C2}} \text{ is the quality factor, and} \quad \text{Eq (3)}$$

$$G = -\frac{R6}{R1} \text{ is the gain of the biquad section.} \quad \text{Eq (4)}$$

The quality factor (Q) of biquad section 240 is determined by R2, R3, R6, C1 and C2. The bandwidth (BW) of the biquad section may be approximated as $$BW = \frac{\omega_0}{Q}.$$

The filter bandwidth may be adjusted by varying C1 and/or C2. The filter bandwidth may also be varied by equally scaling R1, R2, R3 and R6 either up or down. For example, if R1, R2, R3 and R6 are 10 kilo-ohms (KΩ) and the bandwidth is 10 MHz, then a 5 MHz bandwidth may be obtained by changing R1, R2, R3 and R6 to 20 KΩ. The DC gain of the biquad section is determined by the ratio of R6 to R1, as shown in equation (4). The filter gain may be adjusted by varying R1, which affects only the filter gain and not the natural frequency or the quality factor of the biquad section, as shown in equations (1) to (4).

FIG. 3 shows an exemplary design of second-order biquad section 240. A second-order filter section may also be implemented with other topologies such as a voltage-controlled voltage source (VCVS) topology, an infinite gain multi-feedback topology, etc.

FIGS. 2 and 3 show exemplary single-ended designs of lowpass filter 220, biquad section 240, and an amplifier 250, which receive single-ended input signals and provide single-ended output signals. Lowpass filter 220, biquad section 240, and amplifier 250 may also be implemented with differential designs and may receive differential input signals and provide differential output signals.

In the exemplary design shown in FIG. 2, lowpass filter 220 may be operated in a normal mode or a closed-loop tuning mode. In the normal mode, switch 212 is closed, switch 258 is opened, and lowpass filter 220 filters the downconverted signal from mixer 210. In the closed-loop tuning mode, which may also be referred to as an in-situ tuning mode, switch 212 is opened, switch 258 is closed, and lowpass filter 220 and amplifier 250 operate as an oscillator.

The closed-loop tuning mode may be used to adjust the bandwidth of lowpass filter 220, which may also be referred to as bandwidth tuning, bandwidth adjustment, bandwidth calibration, etc. It can be shown that the 3 decibel (dB) bandwidth of lowpass filter 220 is related to (i.e., correlated with) the frequency of oscillation in the closed-loop tuning mode. The relationship between oscillation frequency and filter bandwidth may be determined via computer simulation, lab measurement, etc., and may be stored in a look-up table that is accessible to or located within bandwidth control circuit 280. The bandwidth of lowpass filter 220 may be tuned by operating the lowpass filter in the closed-loop tuning mode, measuring the oscillation frequency, and adjusting variable capacitors and/or resistors within the lowpass filter to obtain a target oscillation frequency that corresponds to the desired filter bandwidth. This target oscillation frequency may be determined from the look-up table.

The closed-loop tuning mode may also be used to adjust the gain of lowpass filter 220, amplifier 250 and/or variable resistor 260, which may also be referred to as gain adjustment, gain tuning, gain calibration, etc. Gain adjustment may be performed to obtain the desired gain for lowpass filter 220 and/or amplifier 250 in the normal mode, to obtain the desired signal amplitude for lowpass filter 220 and/or amplifier 250 in the normal mode, etc. Gain adjustment may also be performed to obtain the desired amplitude for an oscillator signal (e.g., at the output of amplifier 250) in the closed-loop tuning mode. The accuracy of bandwidth tuning may be dependent on the correlation between the oscillation frequency and the filter bandwidth. The oscillation frequency may be dependent on various factors, with power supply voltage being one of the dominating factors.

Figure 4A:
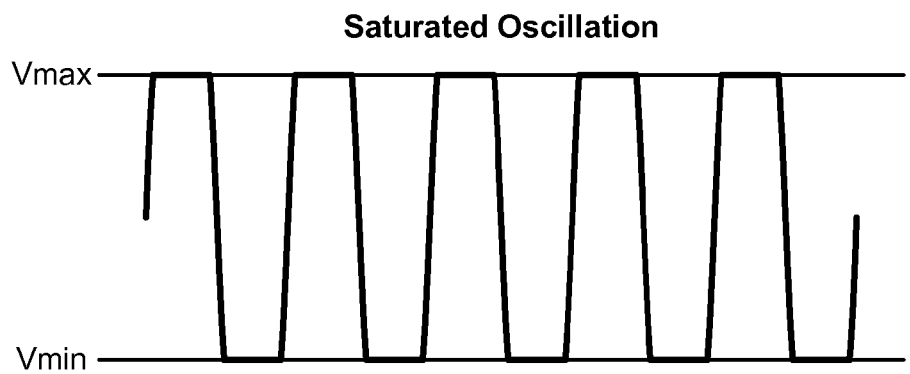
FIG. 4A shows a waveform of saturated oscillation.

FIG. 4A shows a waveform of saturated oscillation. When lowpass filter 220 is operated in the closed-loop tuning mode and the closed-loop gain is too large, the oscillator signal (e.g., at the output of amplifier 250) may have rail-to-rail signal swing and may be clipped at both a maximum voltage (Vmax) and a minimum voltage (Vmin), as shown in FIG. 4A. Vmax may be equal to an upper supply voltage Vdd, and Vmin may be equal to a lower supply voltage Vss, which may be circuit ground.

Figure 4B:
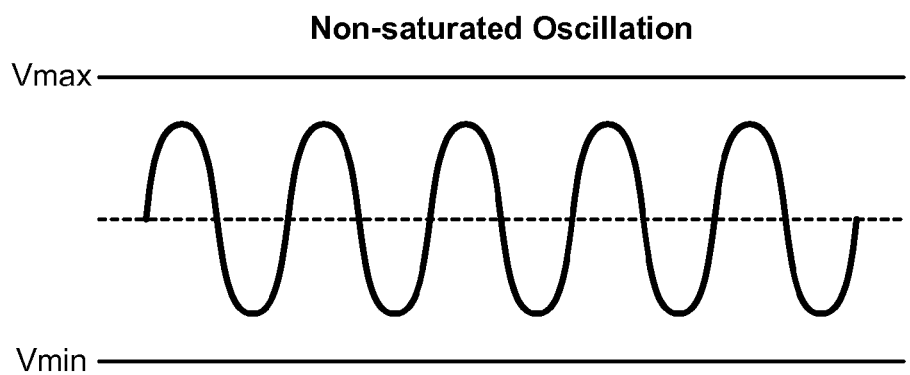
FIG. 4B shows a waveform of non-saturated oscillation.

FIG. 4B shows a waveform of non-saturated oscillation. When lowpass filter 220 is operated in the closed-loop tuning mode and the closed-loop gain is properly set, the oscillator signal may have a signal swing that is within the maximum and minimum voltages, as shown in FIG. 4B.

Table 1 lists four filter bandwidths and gives the non-saturated oscillation frequency as well as the saturated oscillation frequency corresponding to each filter bandwidth, for an exemplary design. Table 1 also gives the percentage difference between the non-saturated oscillation frequency and the saturated oscillation frequency for each filter bandwidth. As shown in Table 1, in the closed-loop tuning mode, the oscillation frequency with rail-to-rail signal swing in FIG. 4A may be different from the oscillation frequency with non rail-to-rail signal swing in FIG. 4B. Furthermore, the difference may vary depending on the filter bandwidth.

TABLE 1

| Filter Bandwidth | Non-saturated Oscillation Frequency | Saturated Oscillation Frequency | Percentage Difference |
|---|---|---|---|
| 2.8 MHz | 2.57 MHz | 2.08 MHz | 80.9% |
| 5.6 MHz | 5.04 MHz | 4.10 MHz | 81.4% |
| 11.2 MHz | 8.40 MHz | 6.90 MHz | 82.1% |
| 22.4 MHz | 14.5 MHz | 12.3 MHz | 84.8% |

The filter bandwidth may correlate better with the non-saturated oscillation frequency than the saturated oscillation frequency. The relationship between oscillation frequency and filter bandwidth may thus be determined for non rail-to-rail signal swing, which may be applicable under normal operation. The accuracy of bandwidth tuning may then be dependent on achieving non rail-to-rail signal swing for the oscillator signal in the closed-loop tuning mode. Non rail-to-rail operation may ensure good correlation between the oscillation frequency and the filter bandwidth, which may improve bandwidth tuning accuracy. Non rail-to-rail operation may also reduce or avoid variations in oscillation frequency due to changes in power supply voltage, so that bandwidth tuning accuracy is minimally affected by variations in the power supply voltage. Gain adjustment may be performed to obtain non rail-to-rail signal swing for the oscillator signal.

Figure 5:
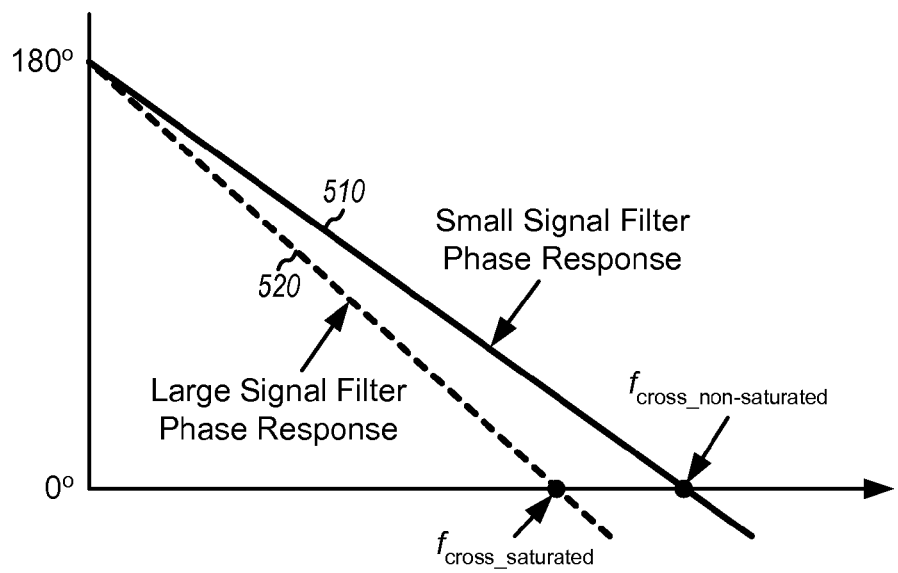
FIG. 5 shows plots of phase versus frequency for a generic filter.

FIG. 5 shows plots of phase response versus frequency for a generic filter. When the filter is configured as an oscillator, its oscillation frequency may be strongly correlated to (or proportional with a factor $a_1$ to) the zero crossing frequency of a small signal phase response, which is shown by a solid line 510. This zero crossing frequency may also be strongly correlated to (or proportional with a factor $a_2$ to) the 3 dB bandwidth of the filter. However, these relationships (or the factors $a_1$ and $a_2$) may be more valid when the filter is not saturated and works in small signal operation. Saturation results from excessive loop gain, which causes the oscillator to work in large signal operation so that the phase response is now changed to a dashed line 520. Saturation may result in factors $a_1$ and $a_2$ being less valid. Also, saturated operation may be more susceptible to supply voltage variations while non-saturated operation may be more immune to these variations.

Referring back to FIG. 2, an oscillator is formed by lowpass filter 220, amplifier 250, and variable resistor 260 in the closed-loop tuning mode. Gain control circuit 270 may be part of a gain control loop that may be enabled in the closed-loop tuning mode. The gain control loop may be composed of gain control circuit 270 and at least one variable gain element. Gain control circuit 270 may receive the oscillator signal from amplifier 250 (as shown in FIG. 2) or a signal from another suitable point in the oscillator (e.g., the output of lowpass filter 220). The variable gain element(s) may include variable resistor 260, one or more variable resistors within lowpass filter 220, variable resistor 254 and/or 256 within amplifier 250, and/or other circuit elements within the oscillator. Resistor 260 is a feedback resistor for the oscillator and may be varied to control the loop gain of the oscillator. The variable gain element(s) may comprise variable resistors (as shown in FIG. 2), variable capacitors, programmable gain amplifiers, and/or other circuit elements that can vary the loop gain of the oscillator.

Gain control circuit 270 may adjust the value(s) of the variable gain element(s) such that the amplitude of the oscillator signal is maintained at a desired level in the closed-loop tuning mode. Gain control circuit 270 may ensure non rail-to-rail operation for the oscillator even with variations in the power supply voltage. This may improve accuracy in bandwidth tuning. Gain control circuit 270 may also be used to adjust one or more variable gain elements in lowpass filter 220 and/or amplifier 250 to obtain the desired gain and/or the desired signal amplitude in the normal mode.

Gain control circuit 270 may adjust a single variable gain element (e.g., variable resistor 260) in the closed-loop tuning mode. Gain control circuit 270 may also adjust one or more variable gain elements for each circuit block being adjusted. For lowpass filter 220, gain control circuit 270 may adjust the gain of first-order section 230 with biquad sections 242a and 242b disabled/bypassed. Gain control circuit 270 may then adjust the gain of biquad section 240a with first-order section 230 enabled and biquad section 242b disabled. Gain control circuit 270 may then adjust the gain of biquad section 240b with all three filter sections 230, 242a and 242b enabled. Each filter section may then operate with the desired gain.

Figure 6:
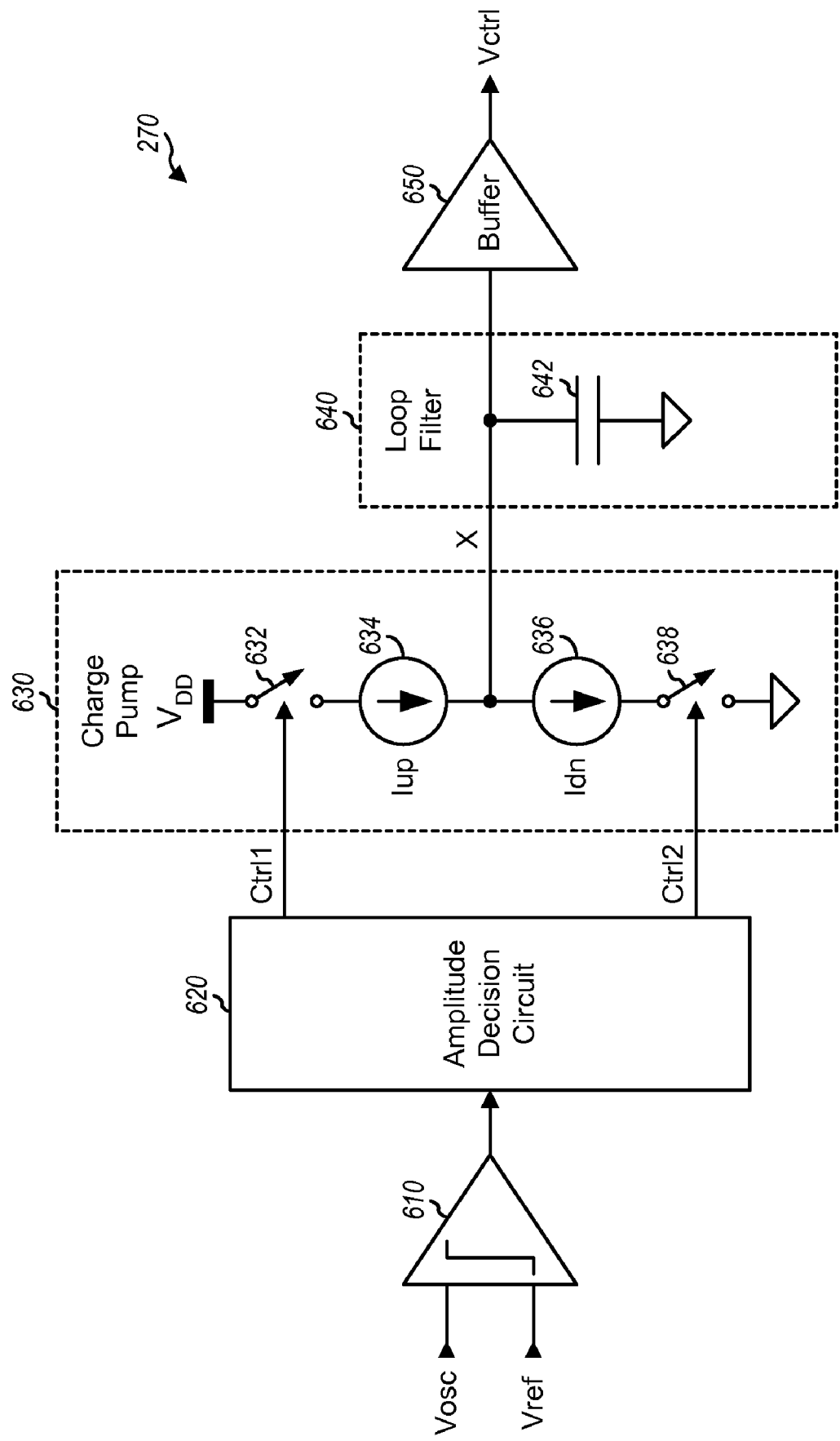
FIG. 6 shows a block diagram of a gain control circuit.

FIG. 6 shows a block diagram of an exemplary design of gain control circuit 270 in FIG. 2. Within gain control circuit 270, a comparator 610 receives the oscillator signal from amplifier 250 at a first input and a reference voltage (Vref) at a second input. The reference voltage determines the target amplitude of the oscillator signal and may be set to a suitable value to obtain the desired amplitude for the oscillator signal. Comparator 610 compares the oscillator signal against the reference voltage and provides a comparator output signal, which indicates whether the oscillator signal is larger or smaller than the reference voltage.

Figure 7:
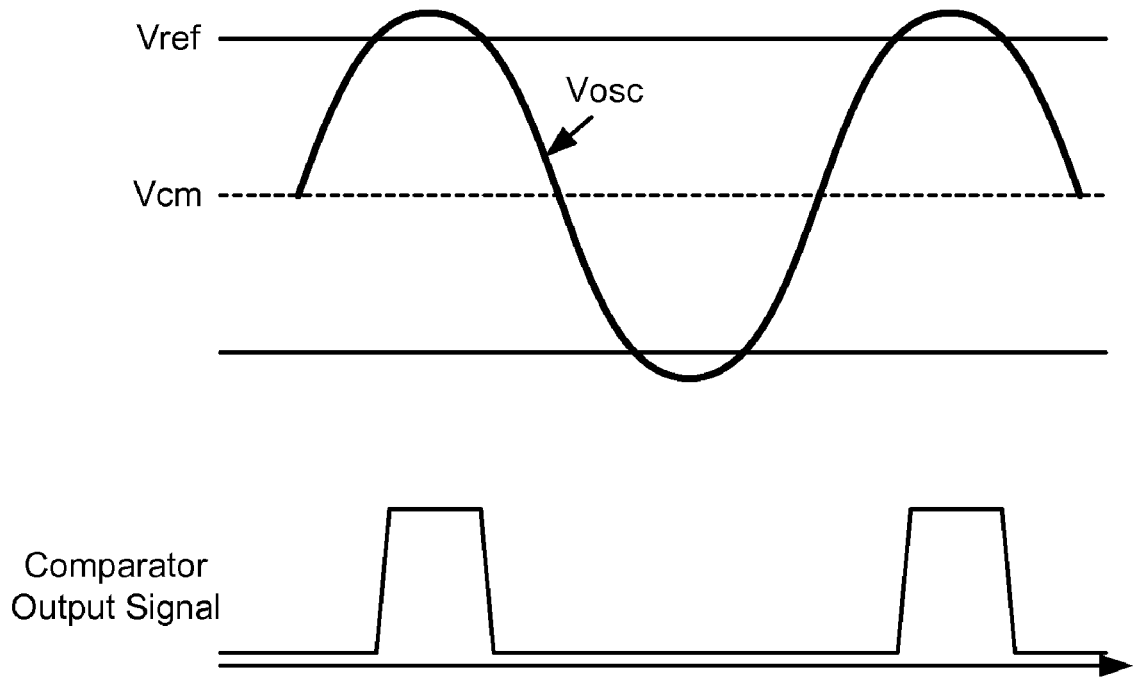
FIG. 7 shows a timing diagram of a comparator detecting oscillator signal swing.

FIG. 7 shows a timing diagram of the operation of comparator 610 in FIG. 6. Comparator 610 may compare the oscillator signal against Vref, which may be either (i) Va higher than a common mode voltage Vcm of the oscillator signal (as shown in FIG. 7) or (ii) Va lower than Vcm (not shown in FIG. 7). Va determines the target amplitude of the oscillator signal. If the oscillator signal swing is higher than Vref, then comparator 610 provides a high pulse. A single comparator may be used to detect for oscillator signal swing above Vref, as shown in FIG. 7. Alternatively, one comparator may be used to detect for oscillator signal swing above Vref_high (which may be equal to Vcm plus Va), and another comparator may be used to detect for oscillator signal swing below Vref_low (which may be equal to Vcm minus Va).

Referring back to FIG. 6, an amplitude decision circuit 620 receives the comparator output signal and generates two control signals—a first control signal (Ctrl1) that is asserted if the oscillator signal amplitude is too small and a second control signal (Ctrl2) that is asserted if the oscillator signal amplitude is too large. In general, the logic levels of the first and second control signals may be dependent on how variable resistors and/or other circuit blocks are implemented.

Within a charge pump 630, a switch 632 and a current source 634 are coupled in series and between node X and a power supply voltage $V_{DD}$ (as shown in FIG. 6) or a voltage from a regulator (not shown in FIG. 6). A current source 636 and a switch 638 are coupled in series and between node X and circuit ground. Switch 632 is opened or closed by the Ctrl1 signal, and switch 638 is opened or closed by the Ctrl2 signal. Within a loop filter 640, a capacitor 642 is coupled between node X and circuit ground. A buffer 650 has its input coupled to node X and its output providing a gain control signal (e.g., a Vctrl voltage) for gain control circuit 270.

Gain control circuit 270 operates as follows. Comparator 610 is an amplitude detection circuit that determines whether the oscillator signal is larger or smaller than the target amplitude. Circuit 620 generates control signals to either increase or decrease the Vctrl voltage based on the comparator output signal. Charge pump 630 provides a charging current (Iup) via current source 634 when switch 632 is closed, which would increase the Vctrl voltage. Charge pump 630 provides a discharging current (Idn) via current source 636 when switch 638 is closed, which would decrease the Vctrl voltage. Capacitor 642 within loop filter 640 averages the charging and discharging currents from charge pump 630. The size of capacitor 640 may be selected to provide the desired amount of averaging. Buffer 650 buffers the voltage at node X and provides the gain control signal.

FIG. 6 shows an exemplary analog design of gain control circuit 270, which generates an analog gain control signal. This analog gain control signal may be used to adjust the gain of lowpass filter 220, amplifier 250, and/or variable resistor 260 in FIG. 2. Gain control circuit 270 may also be implemented with digital circuits or a combination of analog and digital circuits. In one exemplary digital design, the Ctrl1 signal from circuit 620 may be provided to a digital loop filter, which may be implemented with a digital accumulator or an up/down counter. The digital loop filter may filter the Ctrl1 signal and provide a digital gain control signal having sufficient resolution. The digital gain control signal may be used directly to adjust one or more variable resistors. Alternatively, the digital gain control signal may be converted to an analog control signal with a digital-to-analog converter (DAC), and the analog control signal may be used to adjust one or more variable resistors. The digital or analog control signal may also be used to control one or more programmable gain amplifiers or other variable gain elements.

Figure 8:
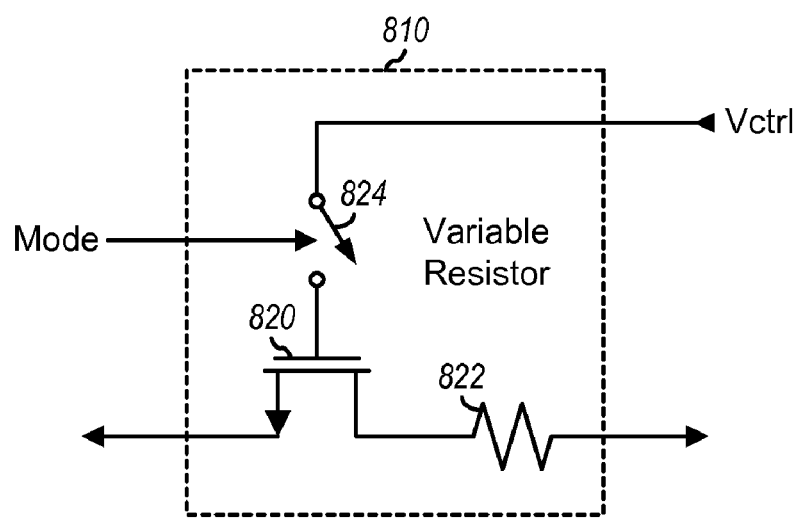
FIG. 8 shows a schematic diagram of a variable resistor.

FIG. 8 shows a schematic diagram of an exemplary design of a variable resistor 810, which may be used for variable resistors 254, 256 and 260 in FIG. 2 and also for variable resistors 312, 316, 318 and 322 in FIG. 3. Within variable resistor 810, an N-channel metal oxide semiconductor (NMOS) transistor 820 has its gate coupled to one end of a switch 824, its drain coupled to one end of a resistor 822, and its source forming one end of variable resistor 810. The other end of resistor 822 forms the other end of variable resistor 810. The other end of switch 824 receives the Vctrl voltage from gain control circuit 270.

Variable resistor 810 operates as follows. Switch 824 may be closed by a mode select signal (Mode) to enable variable adjustment of the resistor value. When switch 824 is closed, the Vctrl voltage is applied to the gate of NMOS transistor 822, and the drain-to-source resistance (Rds) of NMOS transistor 822 is inversely related to the Vctrl voltage. A smaller Rds value may be obtained with a higher Vctrl voltage, and vice versa. Gain control circuit 270 may vary the Vctrl voltage to obtain the desired resistor value for variable resistor 810. Resistor 822 provides a minimum resistor value for variable resistor 810.

Gain control circuit 270 may be enabled in the closed-loop tuning mode and may generate the Vctrl voltage that can provide the desired resistor value for variable resistor 810. Gain control circuit 270 may be disabled in the normal mode. If variable resistor 810 is not used in the normal mode, then switch 824 within variable resistor 810 may be opened, the gate of NMOS transistor 820 may be pulled to logic low, and NMOS transistor 820 may be turned off. If variable resistor 810 is used in the normal mode, then the Vctrl voltage that provides the desired resistor value may be stored, e.g., with a capacitor or a digital storage element. The stored Vctrl value may then be applied to the gate of NMOS transistor 820 to obtain the desired resistor value for variable resistor 810.

FIG. 8 shows an exemplary design of variable resistor 810 using the Rds resistance of an NMOS transistor. A variable resistor may also be implemented in other manners (e.g., with a P-channel MOS (PMOS) transistor instead of an NMOS transistor). A variable resistor may also have continuously variable resistance (e.g., as shown in FIG. 8) or programmable resistance in discrete steps.

Referring back to FIG. 2, bandwidth control circuit 280 may adjust the bandwidth of lowpass filter 220 in the closed-loop tuning mode. Bandwidth control circuit 280 may include a counter that receives the oscillator signal from amplifier 250 and counts the number of oscillator cycles within a known time window. This time window may be generated based on an accurate reference clock. The number of oscillator cycles would then be related to the oscillation frequency. Bandwidth control circuit 280 may determine the target oscillation frequency corresponding to the desired filter bandwidth based on the look-up table that stores the relationship between oscillation frequency and filter bandwidth. Bandwidth control circuit 280 may then vary variable capacitors and/or resistors obtain the target oscillation frequency corresponding to the desired filter bandwidth.

Since the amplitude of the oscillator signal may affect the oscillation frequency, gain adjustment may be performed first to obtain the target amplitude for the oscillator signal. Bandwidth adjustment may then be performed with the oscillator signal set to the target amplitude.

In one exemplary design, an apparatus may include a filter and a gain control circuit. The filter may filter an input signal and provide an output signal in a first mode (e.g., the normal mode) and may operate as part of an oscillator in a second mode (e.g., a closed-loop tuning mode). The filter may comprise multiple filter sections coupled in series, with each filter section implementing a first, second, or higher order. At least one switch may be coupled across at least one filter section, with each switch enabling or disabling an associated filter section. One or more switches (e.g., switches 212 and 258 in FIG. 2) may be used to select the first mode or the second mode.

The gain control circuit may vary the amplitude of an oscillator signal from the oscillator in the second mode. The gain control circuit may adjust at least one variable gain element within the oscillator to obtain a target amplitude and/or non rail-to-rail signal swing for the oscillator signal. In one exemplary design, the gain control circuit may include a comparator and a loop filter, e.g., as shown in FIG. 6. The comparator may compare the oscillator signal against a reference value and provide a comparator output signal. The reference value may determine the target amplitude for the oscillator signal. The loop filter may generate a control signal for the at least one variable gain element based on the comparator output signal. The gain control circuit may include other circuit blocks, e.g., an amplitude decision circuit, a charge pump, a buffer, etc. The gain control circuit may be implemented with analog circuits and/or digital circuits.

The at least one variable gain element may comprise a variable resistor within a feedback path of the oscillator (e.g., resistor 260 in FIG. 2), one or more variable resistors within the filter (e.g., resistors 312 to 322 in FIG. 3), one or more variable resistors within an amplifier coupled to the filter (e.g., resistor 254 and/or 256 in FIG. 2). A variable resistor may comprise a transistor (e.g., NMOS transistor 820 in FIG. 8) that receives a control signal from the gain control circuit and provides variable resistance.

The apparatus may further include a bandwidth control circuit to adjust the bandwidth of the filter in the second mode. The bandwidth control circuit may receive the oscillator signal, determine a target oscillation frequency corresponding to a selected bandwidth for the filter, and adjust at least one circuit element (e.g., capacitor 314 and/or 324 in FIG. 3) within the filter to obtain the target oscillation frequency. The bandwidth control circuit may adjust the bandwidth of the filter after the oscillator signal has been set to the target amplitude by the gain control circuit.

Figure 9:
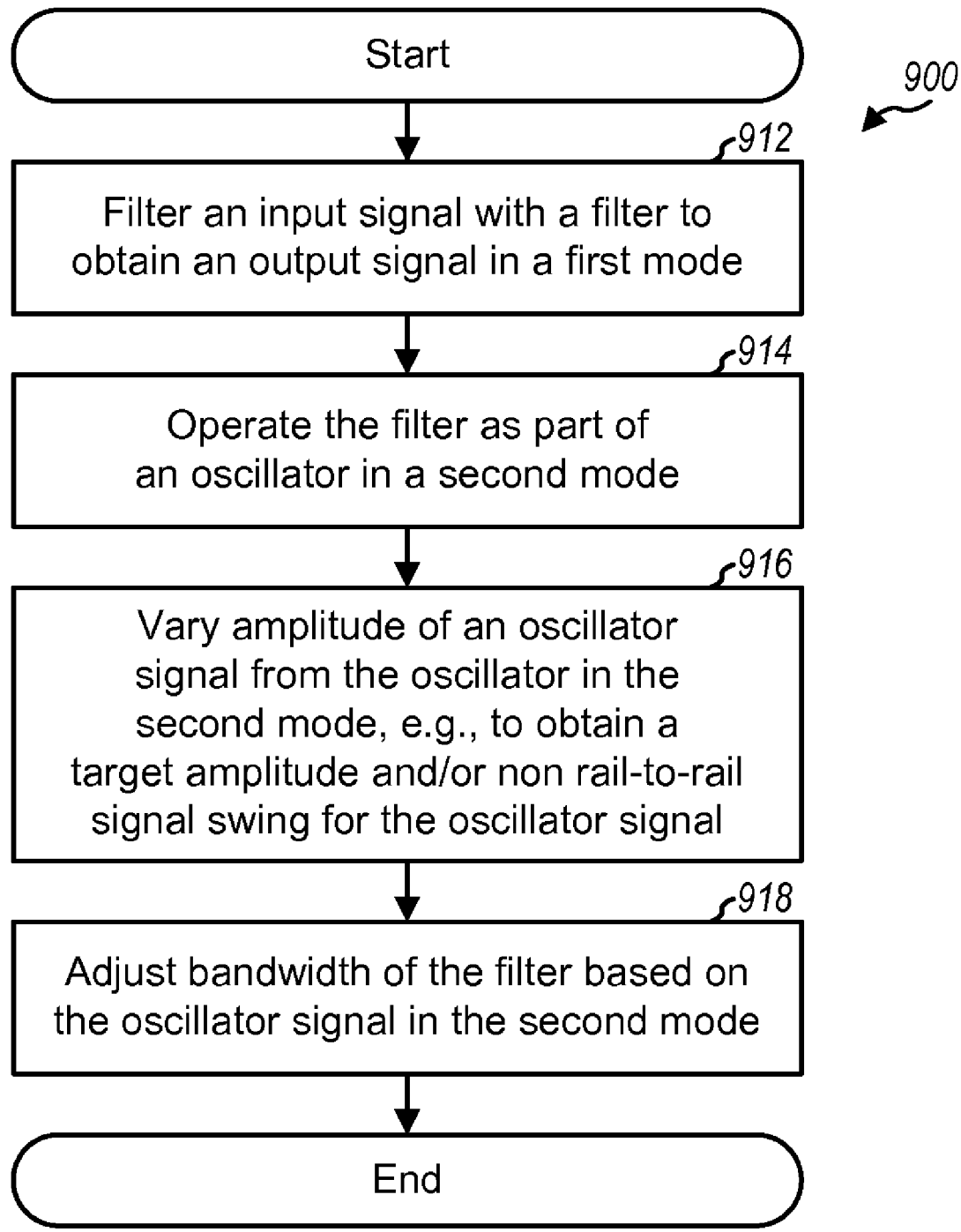
FIG. 9 shows a process for operating a tunable filter with gain control circuit.

FIG. 9 shows an exemplary design of a process 900 for operating a filter. An input signal may be filtered with the filter to obtain an output signal in a first mode (block 912). The filter may be operated as part of an oscillator in a second mode (block 914). The amplitude of an oscillator signal from the oscillator may be varied in the second mode, e.g., by adjusting at least one variable gain element within the oscillator to obtain a target amplitude and/or non rail-to-rail signal swing for the oscillator signal. (block 916). In one exemplary design of block 916, the oscillator signal may be compared against a reference value to obtain a comparator output signal. A control signal may be generated based on the comparator output signal and may be applied to the at least one variable gain element within the oscillator. The bandwidth of the filter may also be adjusted based on the oscillator signal in the second mode (block 918). The bandwidth may be adjusted after the oscillator signal has been set to a target amplitude.

The tunable filter with gain control circuit described herein may be implemented on an IC, an analog IC, an RFIC, a mixed-signal IC, an application specific integrated circuit (ASIC), a printed circuit board (PCB), an electronics device, etc. The tunable filter may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc.

An apparatus implementing the tunable filter described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

The invention claimed is:

1. An apparatus comprising:
   a filter to filter an input signal and provide an output signal in a first mode and to operate as part of an oscillator to tune the filter in a second, closed-loop mode; and
   a gain control circuit to vary amplitude of an oscillator signal from the oscillator in the second mode.

2. The apparatus of claim 1, the gain control circuit adjusting at least one variable gain element within the oscillator to obtain a target amplitude, or non rail-to-rail signal swing, or both for the oscillator signal.

3. The apparatus of claim 2, the gain control circuit comprising
   a comparator to compare the oscillator signal against a reference value and provide a comparator output signal, the reference value determining the target amplitude of the oscillator signal, and
   a loop filter to generate a control signal for the at least one variable gain element based on the comparator output signal.

4. The apparatus of claim 2, the at least one variable gain element comprising a variable resistor within a feedback path of the oscillator.

5. The apparatus of claim 2, the at least one variable gain element comprising a variable resistor within the filter.

6. The apparatus of claim 2, further comprising:
   an amplifier coupled to the filter and providing a variable gain, the at least one variable gain element comprising at least one variable resistor within the amplifier.

7. The apparatus of claim 2, the at least one variable gain element comprising a variable resistor, the variable resistor comprising a transistor to receive a control signal from the gain control circuit and provide variable resistance.

8. The apparatus of claim 1, further comprising:
   a bandwidth control circuit to adjust bandwidth of the filter in the second mode.

9. The apparatus of claim 8, the bandwidth control circuit receiving the oscillator signal, determining a target oscillation frequency corresponding to a selected bandwidth for the filter, and adjusting at least one circuit element within the filter to obtain the target oscillation frequency.

10. The apparatus of claim 9, the bandwidth control circuit adjusting the bandwidth of the filter after the oscillator signal has been adjusted to a target amplitude by the gain control circuit.

11. The apparatus of claim 1, the filter comprising
    multiple filter sections coupled in series, each filter section implementing a first or second order section.

12. The apparatus of claim 11, the filter further comprising
    at least one switch coupled across at least one filter section among the multiple filter sections, each switch enabling or disabling an associated filter section.

13. An integrated circuit comprising:
    a filter to filter an input signal and provide an output signal in a first mode and to operate as part of an oscillator to tune the filter in a second, closed-loop mode; and
    a gain control circuit to vary amplitude of an oscillator signal from the oscillator in the second mode.

14. The integrated circuit of claim 13, the gain control circuit adjusting at least one variable gain element within the oscillator to obtain a target amplitude, or non rail-to-rail signal swing, or both for the oscillator signal.

15. The integrated circuit of claim 13, further comprising:
    a bandwidth control circuit to adjust bandwidth of the filter in the second mode.

16. A wireless device comprising:
    a downconverter to frequency downconvert an input signal and provide a downconverted signal;
    a filter to filter the downconverted signal and provide an output signal in a first mode and to operate as part of an oscillator to tune the filter in a second, closed-loop mode; and
    a gain control circuit to vary amplitude of an oscillator signal from the oscillator in the second mode.

17. The wireless device of claim 16, further comprising:
    a bandwidth control circuit to adjust bandwidth of the filter in the second mode.

18. A method comprising:
    filtering an input signal with a filter to obtain an output signal in a first mode;
    operating the filter as part of an oscillator to tune the filter in a second, closed-loop mode; and
    varying amplitude of an oscillator signal from the oscillator in the second mode.

19. The method of claim 18, the varying the amplitude of the oscillator signal comprising
    comparing the oscillator signal against a reference value to obtain a comparator output signal, and
    generating a control signal for at least one variable gain element within the oscillator based on the comparator output signal.

20. The method of claim 18, the varying the amplitude of the oscillator signal comprising adjusting at least one variable gain element within the oscillator to obtain a target amplitude, or non rail-to-rail signal swing, or both for the oscillator signal.

21. The method of claim 18, further comprising:
    adjusting bandwidth of the filter based on the oscillator signal in the second mode, the bandwidth being adjusted after the oscillator signal has been adjusted to a target amplitude.

22. An apparatus comprising:
    means for filtering an input signal with a filter to obtain an output signal in a first mode;
    means for operating the filter as part of an oscillator to tune the filter in a second, closed loop mode; and
    means for varying amplitude of an oscillator signal from the oscillator in the second mode.

23. The apparatus of claim 22, the means for varying the amplitude of the oscillator signal comprising
    means for comparing the oscillator signal against a reference value to obtain a comparator output signal, and means for generating a control signal for at least one variable gain element within the oscillator based on the comparator output signal.

24. The apparatus of claim 22, the means for varying the amplitude of the oscillator signal comprising means for adjusting at least one variable gain element within the oscillator to obtain a target amplitude, or non rail-to-rail signal swing, or both for the oscillator signal.

25. The apparatus of claim 22, further comprising:
means for adjusting bandwidth of the filter based on the oscillator signal in the second mode, the bandwidth being adjusted after the oscillator signal has been adjusted to a target amplitude.

* * * * *